United States Patent
Yoon et al.

(10) Patent No.: US 6,827,978 B2
(45) Date of Patent: *Dec. 7, 2004

(54) DEPOSITION OF TUNGSTEN FILMS

(75) Inventors: Hyungsuk A. Yoon, San Jose, CA (US); Hongbin Fang, Mountain View, CA (US); Michael X. Yang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 10/074,898

(22) Filed: Feb. 11, 2002

(65) Prior Publication Data

US 2003/0153181 A1 Aug. 14, 2003

(51) Int. Cl.[7] .............................................. C23C 16/14
(52) U.S. Cl. ............... 427/250; 427/255.7; 427/255.29; 427/255.394
(58) Field of Search ............................. 427/250, 255.7, 427/255.29, 255.394

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,849,260 A * | 7/1989 | Kusumoto et al. .......... 427/250 |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |

(List continued on next page.)

FOREIGN PATENT DOCUMENTS

| | | |
|---|---|---|
| DE | 196 27 017 A1 | 1/1997 |
| DE | 198 20 147 A1 | 7/1999 |
| EP | 0 344 352 A1 | 6/1988 |

(List continued on next page.)

OTHER PUBLICATIONS

Hultman, et al., "Review of the thermal and mechanical stability of TiN–based thin films", *Zeitschrift Fur Metallkunde*, 90(10) (Oct. 1999), pp. 803–813.

(List continued on next page.)

*Primary Examiner*—Bret Chen
(74) *Attorney, Agent, or Firm*—Moser Patterson Sheridan (57) ABSTRACT

A method of forming a composite tungsten film on a substrate is described. The composite tungsten film comprises sequentially deposited tungsten nucleation layers and tungsten bulk layers. Each of the tungsten nucleation layers and the tungsten bulk layers have a thickness less than about 300 Å. The tungsten nucleation layers and the tungsten bulk layers are formed one over the other until a desired thickness for the composite tungsten film is achieved. The resulting composite tungsten film exhibits good film morphology. The tungsten nucleation layers may be formed using a cyclical deposition process by alternately adsorbing a tungsten-containing precursor and a reducing gas on the substrate. The tungsten bulk layers may be formed using a chemical vapor deposition (CVD) process by thermally decomposing a tungsten-containing precursor.

43 Claims, 8 Drawing Sheets

U.S. PATENT DOCUMENTS

| | | | |
|---|---|---|---|
| 4,960,720 A | 10/1990 | Shimbo | |
| 4,975,252 A | 12/1990 | Nishizawa et al. | |
| 4,993,357 A | 2/1991 | Scholz | |
| 5,000,113 A | 3/1991 | Wang et al. | |
| 5,006,371 A * | 4/1991 | Garg et al. | 427/249.17 |
| 5,013,683 A | 5/1991 | Petroff et al. | |
| 5,028,565 A | 7/1991 | Chang et al. | |
| 5,082,798 A | 1/1992 | Arimoto | |
| 5,085,885 A | 2/1992 | Foley et al. | |
| 5,091,320 A | 2/1992 | Aspnes et al. | |
| 5,130,269 A | 7/1992 | Kitahara et al. | |
| 5,166,092 A | 11/1992 | Mochizuki et al. | |
| 5,173,474 A | 12/1992 | Connell et al. | |
| 5,186,718 A | 2/1993 | Tepman et al. | |
| 5,205,077 A | 4/1993 | Wittstock | |
| 5,225,366 A | 7/1993 | Yoder | |
| 5,234,561 A | 8/1993 | Randhawa et al. | |
| 5,246,536 A | 9/1993 | Nishizawa et al. | |
| 5,250,148 A | 10/1993 | Nishizawa et al. | |
| 5,254,207 A | 10/1993 | Nishizawa et al. | |
| 5,256,244 A | 10/1993 | Ackerman | |
| 5,259,881 A | 11/1993 | Edwards et al. | |
| 5,270,247 A | 12/1993 | Sakuma et al. | |
| 5,278,435 A | 1/1994 | Van Hove et al. | |
| 5,281,274 A | 1/1994 | Yoder | |
| 5,286,296 A | 2/1994 | Sato et al. | |
| 5,290,748 A | 3/1994 | Knuuttila et al. | |
| 5,294,286 A | 3/1994 | Nishizawa et al. | |
| 5,296,403 A | 3/1994 | Nishizawa et al. | |
| 5,300,186 A | 4/1994 | Kitahara et al. | |
| 5,306,666 A | 4/1994 | Izumi | |
| 5,311,055 A | 5/1994 | Goodman et al. | |
| 5,316,615 A | 5/1994 | Copel et al. | |
| 5,316,793 A | 5/1994 | Wallace et al. | |
| 5,330,610 A | 7/1994 | Eres et al. | |
| 5,336,324 A | 8/1994 | Stall et al. | |
| 5,338,389 A | 8/1994 | Nishizawa et al. | |
| 5,348,911 A | 9/1994 | Jurgensen et al. | |
| 5,374,570 A | 12/1994 | Nasu et al. | |
| 5,395,791 A | 3/1995 | Cheng et al. | |
| 5,407,698 A * | 4/1995 | Emesh | 427/99 |
| 5,429,991 A * | 7/1995 | Iwasaki et al. | 438/653 |
| 5,438,952 A | 8/1995 | Otsuka | |
| 5,439,876 A | 8/1995 | Graf et al. | |
| 5,441,703 A | 8/1995 | Jurgensen | |
| 5,443,033 A | 8/1995 | Nishizawa et al. | |
| 5,443,646 A * | 8/1995 | Yamada et al. | 118/722 |
| 5,443,647 A | 8/1995 | Aucoin et al. | |
| 5,455,072 A | 10/1995 | Bension et al. | |
| 5,458,084 A | 10/1995 | Thorne et al. | |
| 5,469,806 A | 11/1995 | Mochizuki et al. | |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,503,875 A | 4/1996 | Imai et al. | |
| 5,521,126 A | 5/1996 | Okamura et al. | |
| 5,527,733 A | 6/1996 | Nishizawa et al. | |
| 5,532,511 A | 7/1996 | Nishizawa et al. | |
| 5,540,783 A | 7/1996 | Eres et al. | |
| 5,580,380 A | 12/1996 | Liu et al. | |
| 5,601,651 A | 2/1997 | Watabe | |
| 5,609,689 A | 3/1997 | Kato et al. | |
| 5,616,181 A | 4/1997 | Yamamoto et al. | |
| 5,637,530 A | 6/1997 | Gaines et al. | |
| 5,641,984 A | 6/1997 | Aftergut et al. | |
| 5,644,128 A | 7/1997 | Wollnik et al. | |
| 5,667,592 A | 9/1997 | Boitnott et al. | |
| 5,674,786 A | 10/1997 | Turner et al. | |
| 5,693,139 A | 12/1997 | Nishizawa et al. | |
| 5,695,564 A | 12/1997 | Imahashi | |
| 5,705,224 A | 1/1998 | Murota et al. | |
| 5,707,880 A | 1/1998 | Aftergut et al. | |
| 5,711,811 A | 1/1998 | Suntola et al. | |
| 5,730,801 A | 3/1998 | Tepman et al. | |
| 5,730,802 A | 3/1998 | Ishizumi et al. | |
| 5,747,113 A | 5/1998 | Tsai | |
| 5,749,974 A | 5/1998 | Habuka et al. | |
| 5,788,447 A | 8/1998 | Yonemitsu et al. | |
| 5,788,799 A | 8/1998 | Steger et al. | |
| 5,796,116 A | 8/1998 | Nakata et al. | |
| 5,801,634 A | 9/1998 | Young et al. | |
| 5,807,792 A | 9/1998 | Ilg et al. | |
| 5,830,270 A | 11/1998 | McKee et al. | |
| 5,835,677 A | 11/1998 | Li et al. | |
| 5,851,849 A | 12/1998 | Comizzoli et al. | |
| 5,855,675 A | 1/1999 | Doering et al. | |
| 5,855,680 A | 1/1999 | Soininen et al. | |
| 5,856,219 A | 1/1999 | Naito et al. | |
| 5,858,102 A | 1/1999 | Tsai | |
| 5,866,213 A | 2/1999 | Foster et al. | |
| 5,866,795 A | 2/1999 | Wang et al. | |
| 5,879,459 A | 3/1999 | Gadgil et al. | |
| 5,882,165 A | 3/1999 | Maydan et al. | |
| 5,882,413 A | 3/1999 | Beaulieu et al. | |
| 5,904,565 A | 5/1999 | Nguyen et al. | |
| 5,916,365 A | 6/1999 | Sherman | |
| 5,923,056 A | 7/1999 | Lee et al. | |
| 5,923,985 A | 7/1999 | Aoki et al. | |
| 5,925,574 A | 7/1999 | Aoki et al. | |
| 5,928,389 A | 7/1999 | Jevtic | |
| 5,942,040 A | 8/1999 | Kim et al. | |
| 5,947,710 A | 9/1999 | Cooper et al. | |
| 5,972,430 A | 10/1999 | DiMeo, Jr. et al. | |
| 6,001,669 A | 12/1999 | Gaines et al. | |
| 6,015,590 A | 1/2000 | Suntola et al. | |
| 6,025,627 A | 2/2000 | Forbes et al. | |
| 6,036,773 A | 3/2000 | Wang et al. | |
| 6,042,652 A | 3/2000 | Hyun et al. | |
| 6,043,177 A | 3/2000 | Falconer et al. | |
| 6,051,286 A | 4/2000 | Zhao et al. | |
| 6,062,798 A | 5/2000 | Muka | |
| 6,071,808 A | 6/2000 | Merchant et al. | |
| 6,084,302 A | 7/2000 | Sandhu | |
| 6,086,677 A | 7/2000 | Umotoy et al. | |
| 6,110,556 A | 8/2000 | Bang et al. | |
| 6,113,977 A | 9/2000 | Soininen et al. | |
| 6,117,244 A | 9/2000 | Bang et al. | |
| 6,124,158 A | 9/2000 | Dautartas et al. | |
| 6,130,147 A | 10/2000 | Major et al. | |
| 6,139,700 A | 10/2000 | Kang et al. | |
| 6,140,237 A | 10/2000 | Chan et al. | |
| 6,140,238 A | 10/2000 | Kitch | |
| 6,143,659 A | 11/2000 | Leem | |
| 6,144,060 A | 11/2000 | Park et al. | |
| 6,158,446 A | 12/2000 | Mohindra et al. | |
| 6,174,377 B1 | 1/2001 | Doering et al. | |
| 6,174,809 B1 | 1/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,302 B1 | 3/2001 | Sugiura et al. | |
| 6,207,487 B1 | 3/2001 | Kim et al. | |
| 6,218,301 B1 * | 4/2001 | Yoon et al. | 438/685 |
| 6,248,605 B1 | 6/2001 | Harkonen et al. | |
| 6,270,572 B1 | 8/2001 | Kim et al. | |
| 6,271,148 B1 | 8/2001 | Kao et al. | |
| 6,284,646 B1 | 9/2001 | Leem | |
| 6,287,965 B1 | 9/2001 | Kang et al. | |
| 6,291,876 B1 | 9/2001 | Stumborg et al. | |
| 6,305,314 B1 | 10/2001 | Sneh et al. | |
| 6,306,216 B1 | 10/2001 | Kim et al. | |

| | | | |
|---|---|---|---|
| 6,316,098 B1 | 11/2001 | Yitzchaik et al. | |
| 6,333,260 B1 | 12/2001 | Kwon et al. | |
| 6,342,277 B1 | 1/2002 | Sherman | |
| 6,355,561 B1 | 3/2002 | Sandhu et al. | |
| 6,358,829 B2 | 3/2002 | Yoon et al. | |
| 6,368,954 B1 | 4/2002 | Lopatin et al. | |
| 6,369,430 B1 | 4/2002 | Adetutu et al. | |
| 6,372,598 B2 | 4/2002 | Kang et al. | |
| 6,391,785 B1 | 5/2002 | Satta et al. | |
| 6,399,491 B2 | 6/2002 | Jeon et al. | |
| 6,420,189 B1 | 7/2002 | Lopatin | |
| 6,423,619 B1 | 7/2002 | Grant et al. | |
| 6,447,933 B1 | 9/2002 | Wang et al. | |
| 6,451,695 B2 | 9/2002 | Sneh | |
| 6,468,924 B2 | 10/2002 | Lee et al. | |
| 6,475,276 B1 | 11/2002 | Elers et al. | |
| 6,475,910 B1 | 11/2002 | Sneh | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,534,395 B2 | 3/2003 | Werkhoven et al. | |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0011526 A1 | 8/2001 | Doering et al. | |
| 2001/0024387 A1 | 9/2001 | Raaijmakers et al. | |
| 2001/0028924 A1 | 10/2001 | Sherman | |
| 2001/0029094 A1 | 10/2001 | Mee-Young et al. | |
| 2001/0031562 A1 | 10/2001 | Raaijmakers et al. | |
| 2001/0034123 A1 | 10/2001 | Jeon et al. | |
| 2001/0041250 A1 | 11/2001 | Werkhoven et al. | |
| 2001/0042799 A1 | 11/2001 | Kim et al. | |
| 2001/0054730 A1 | 12/2001 | Kim et al. | |
| 2001/0054769 A1 | 12/2001 | Raaijmakers et al. | |
| 2002/0000598 A1 | 1/2002 | Kang et al. | |
| 2002/0004293 A1 | 1/2002 | Soininen et al. | |
| 2002/0007790 A1 | 1/2002 | Park | |
| 2002/0019121 A1 | 2/2002 | Pyo | |
| 2002/0031618 A1 | 3/2002 | Sherman | |
| 2002/0037630 A1 | 3/2002 | Agarwal et al. | |
| 2002/0048880 A1 | 4/2002 | Lee | |
| 2002/0052097 A1 | 5/2002 | Park | |
| 2002/0055235 A1 | 5/2002 | Agarwal et al. | |
| 2002/0061612 A1 | 5/2002 | Sandhu et al. | |
| 2002/0076507 A1 | 6/2002 | Chiang et al. | |
| 2002/0076837 A1 | 6/2002 | Hujanen et al. | |
| 2002/0090829 A1 | 7/2002 | Sandhu et al. | |
| 2002/0094689 A1 | 7/2002 | Park | |
| 2002/0105088 A1 | 8/2002 | Yang et al. | |
| 2002/0106846 A1 | 8/2002 | Seutter et al. | |
| 2002/0109168 A1 | 8/2002 | Kim et al. | |
| 2002/0117399 A1 | 8/2002 | Chen et al. | |
| 2002/0121697 A1 | 9/2002 | Marsh | |
| 2002/0155722 A1 | 10/2002 | Satta et al. | |
| 2002/0162506 A1 | 11/2002 | Sneh et al. | |
| 2002/0182320 A1 | 12/2002 | Leskela et al. | |
| 2002/0187256 A1 | 12/2002 | Elers et al. | |
| 2002/0187631 A1 | 12/2002 | Kim et al. | |
| 2003/0013320 A1 | 1/2003 | Kim et al. | |
| 2003/0031807 A1 | 2/2003 | Elers et al. | |
| 2003/0032281 A1 | 2/2003 | Werkhoven et al. | |
| 2003/0049942 A1 | 3/2003 | Haukka et al. | |
| 2003/0072975 A1 | 4/2003 | Shero et al. | |

FOREIGN PATENT DOCUMENTS

| | | |
|---|---|---|
| EP | 0 442 290 A1 | 2/1991 |
| EP | 0 429 270 A2 | 5/1991 |
| EP | 0 799 641 A2 | 10/1997 |
| EP | 1167569 | 1/2002 |
| FR | 2.626.110 | 7/1989 |
| FR | 2.692.597 | 12/1993 |
| GB | 2 355 727 A | 5/2001 |
| JP | 58-098917 | 6/1983 |
| JP | 58-100419 | 6/1983 |
| JP | 60-065712 A | 4/1985 |
| JP | 61-035847 | 2/1986 |
| JP | 61-210623 | 9/1986 |
| JP | 62-069508 | 3/1987 |
| JP | 62-091495 | 4/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 63-266814 | 11/1988 |
| JP | 64-009895 | 1/1989 |
| JP | 64-009896 | 1/1989 |
| JP | 64-009897 | 1/1989 |
| JP | 64-037832 | 2/1989 |
| JP | 64-082615 | 3/1989 |
| JP | 64-082617 | 3/1989 |
| JP | 64-082671 | 3/1989 |
| JP | 64-082676 | 3/1989 |
| JP | 01-103982 | 4/1989 |
| JP | 01-103996 | 4/1989 |
| JP | 64-090524 | 4/1989 |
| JP | 01-117017 | 5/1989 |
| JP | 01-143221 | 6/1989 |
| JP | 01-143233 | 6/1989 |
| JP | 01-154511 | 6/1989 |
| JP | 01-236657 | 9/1989 |
| JP | 01-245512 | 9/1989 |
| JP | 01-264218 | 10/1989 |
| JP | 01-270593 | 10/1989 |
| JP | 01-272108 | 10/1989 |
| JP | 01-290221 | 11/1989 |
| JP | 01-290222 | 11/1989 |
| JP | 01-296673 | 11/1989 |
| JP | 01-303770 | 12/1989 |
| JP | 01-305894 | 12/1989 |
| JP | 01-313927 | 12/1989 |
| JP | 02-012814 | 1/1990 |
| JP | 02-014513 | 1/1990 |
| JP | 02-017634 | 1/1990 |
| JP | 02-063115 | 3/1990 |
| JP | 02-074029 | 3/1990 |
| JP | 02-074587 | 3/1990 |
| JP | 02-106822 | 4/1990 |
| JP | 02-129913 | 5/1990 |
| JP | 02-162717 | 6/1990 |
| JP | 02-172895 | 7/1990 |
| JP | 02-196092 | 8/1990 |
| JP | 02-203517 | 8/1990 |
| JP | 02-230690 | 9/1990 |
| JP | 02-230722 | 9/1990 |
| JP | 02-246161 | 10/1990 |
| JP | 02-264491 | 10/1990 |
| JP | 02-283084 | 11/1990 |
| JP | 02-304916 | 12/1990 |
| JP | 03-019211 | 1/1991 |
| JP | 03-022569 | 1/1991 |
| JP | 03-023294 | 1/1991 |
| JP | 03-023299 | 1/1991 |
| JP | 03-044967 | 2/1991 |
| JP | 03-048421 | 3/1991 |

| | | |
|---|---|---|
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 03-286531 | 12/1991 |
| JP | 04-031391 | 2/1992 |
| JP | 04-031396 | 2/1992 |
| JP | 04-100292 | 4/1992 |
| JP | 04-111418 | 4/1992 |
| JP | 04-132214 | 5/1992 |
| JP | 04-132681 | 5/1992 |
| JP | 04/151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04-260696 | 9/1992 |
| JP | 04-273120 | 9/1992 |
| JP | 04-285167 | 10/1992 |
| JP | 04-291916 | 10/1992 |
| JP | 04-325500 | 11/1992 |
| JP | 04-328874 | 11/1992 |
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-319772 | 3/2000 |
| JP | 2000-138094 | 5/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-111000 | 4/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | 90/02216 | 3/1990 |
| WO | 91/10510 | 7/1991 |
| WO | 93/0211 | 2/1993 |
| WO | 96/17107 | 6/1996 |
| WO | 96/18756 | 6/1996 |
| WO | 98/06889 | 2/1998 |
| WO | 98/51838 | 11/1998 |
| WO | 99/13504 | 3/1999 |
| WO | 99/29924 | 6/1999 |
| WO | 99/41423 | 8/1999 |
| WO | 00/11721 | 3/2000 |
| WO | 00/15865 | 3/2000 |
| WO | 00/15881 A2 | 3/2000 |
| WO | 00/16377 A2 | 3/2000 |
| WO | 00/54320 A1 | 9/2000 |
| WO | 00/63957 A1 | 10/2000 |
| WO | 00/79019 A1 | 12/2000 |
| WO | 00/79576 A1 | 12/2000 |
| WO | 01/15220 A1 | 3/2001 |
| WO | 01/15220 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/40541 A1 | 6/2001 |
| WO | 01/66832 A2 | 9/2001 |
| WO | 02/45167 | 6/2002 |
| WO | 02/067319 | 8/2002 |

OTHER PUBLICATIONS

Klaus, et al., "Atomic Layer Deposition of $SiO_2$ Using Catalyzed and Uncatalyzed Self–Limiting Surface Reactions", Surface Review & Letters, 6(3&4) (1999), pp. 435–448.

Yamaguchi, et al., "Atomic–layer chemical–vapor–deposition of silicon dioxide films with extremely low hydrogen content", Appl. Surf. Sci., vol. 130–132 (1998), pp. 202–207.

George, et al., "Surface Chemistry for Atomic Layer Growth", J. Phys. Chem., vol. 100 (1996), pp. 13121–13131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460–467.

Wise, et al., "Diethyldiethoxysilane as a new precursor for $SiO_2$ growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci. & Eng., vol. B41 (1996), pp. 23–29.

Ritala, et al., "Perfectly conformal TiN and Al₂O₃ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions", *Appl. Surf. Sci.*, vol. 162–163 (Jul. 1999), pp. 479–491.

Klaus, et al., "Atomically controlled growth of tungsten and tungsten nitride using sequential surface reactions", *Fifth Int'l Symp. On Atomically Controlled Surfaces, Interfaces and Nanostructures* (Jul. 6–9, 1999), Aix en Provence, France, no page numbers.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Min, et al., "Metal–Organic Atomic–Layer Deposition of Titanium–Silicon–Nitride Films", *Applied Physics Letters*, American Inst. Of Physics, vol. 75(11) (Sep. 13, 1999), no page numbers.

Maertensson, et al., "Atomic Layer Epitaxy of Copper on Tantalum", *Chemical Vapor Deposition*, 3(1) (Feb. 1, 1997), pp. 45–50.

Ritala, et al., "Atomic Layer Epitaxy Growth of TiN Thin Films", *J. Electrochem. Soc.*, 142(8) (Aug. 1995), pp. 2731–2737.

Elers, et al., "NbCl5 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as precursors", *Chemical Vapor Deposition*, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.*, 145(8) (Aug. 1998), pp. 2926–2931.

Min, et al., "Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Technol.* 12(1) (Jan./Feb. 1994), no page numbers.

Yamaga, et al., "Atomic layer epitaxy of ZnS by a new gas supplying system in a low–pressure metalorganic vapor phase epitaxy", *J. of Crystal Growth* 117 (1992), pp. 152–155.

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C.–hydrazine–reduced TiN film with low resistivity", IEDM 92–979, pp. 11.8.1–11.8.3.

Suzuki, et al., "LPCVD–TiN Using Hydrazine and TiCl₄", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480, not a publication.

NERAC Search abstract of "Atomic Layer deposition of Ta and Ti for Interconnect Diffusion Barriers", by Rossnagel, et al., J. Vac. Sci. & Tech., 18(4) (Jul. 2000).

Bader, et al., "Integrated Processing Equipment", Solid State Technology, Cowan Pub., vol. 33, No. 5 (May 1, 1990), pp. 149–154, not a publication.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of TiB₂ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, 22$^{nd}$ Conference Solid State Devices and Materials (1990), pp. 849–852 XP000178141.

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2002), pp. 649–654.

\* cited by examiner

FILM PROPERTIES OF COMPOSITE TUNGSTEN FILMS

| SAMPLE | RESISTIVITY | REFLECTIVITY | ROUGHNESS (nm) | | |
|---|---|---|---|---|---|
| | | | R rms | Ra | R max |
| A | 21.5 | 120% | 5.76 | 4.58 | 42.74 |
| B | 20.5 | 120% | 5.39 | 4.27 | 37.65 |
| C | 14 | 110% | 11.51 | 9.48 | 67.09 |

SAMPLE A: 50A NUC/200A BULK/20A NUC/200A BULK/20A NUC/200A BULK/20A NUC/200A BULK/20A NUC/200A BULK/50A NUC

SAMPLE B: 50A NUC/200A BULK/20A NUC/200A BULK/20A NUC/200A BULK/20A NUC/200A BULK/20A NUC/200A BULK

SAMPLE C: 50A NUC/1000A BULK

DEPOSITION OF TUNGSTEN FILMS

BACKGROUND OF THE DISCLOSURE

1. Field of the Invention

Embodiments of the present invention generally relate to a method of tungsten film deposition and, more particularly, to a method of forming a tungsten film having good film morphology.

2. Description of the Related Art

In the manufacture of integrated circuits, tungsten (W) films are often used as contact metallization or plug metallization for interconnect schemes. Tungsten (W) films may also be used as a diffusion barrier for copper (Cu) in various metallization schemes.

The tungsten (W) films are typically composite films comprising a thin tungsten (W) nucleation layer (thickness of about 50 Å to about 150 Å) and a thicker bulk tungsten layer (thickness of about 500 Å to about 2000 Å) formed thereover. However, tungsten films comprised of a thin tungsten nucleation layer and a thick bulk tungsten layer tend to have poor film morphology. The morphology of a film refers to its surface roughness, and grain structure.

For example, tungsten (W) films comprising a thin tungsten nucleation layer and a thick bulk tungsten layer typically have large grain sizes (e.g., grain sizes of greater than about 10 nm/rms). Large grain sizes produce rough surfaces, which are undesirable for subsequent lithography steps performed thereover.

Therefore, a need exists in the art for a method of forming tungsten films having good film morphology.

SUMMARY OF THE INVENTION

A method of forming a composite tungsten film on a substrate is provided The composite tungsten film comprises sequentially deposited tungsten nucleation layers and tungsten bulk layers. Each of the tungsten nucleation layers and the tungsten bulk layers have a thickness less than about 300 Å. The tungsten nucleation layers and the tungsten bulk layers are formed one over the other until a desired thickness for the composite tungsten film is achieved. The resulting composite tungsten film exhibits good film morphology.

The tungsten nucleation layers may be formed using a cyclical deposition process by alternately adsorbing a tungsten-containing precursor and a reducing gas on the substrate. The tungsten bulk layers may be formed using a chemical vapor deposition (CVD) process by thermally decomposing a tungsten-containing precursor.

The composite tungsten film is compatible with integrated circuit fabrication processes. In one integrated circuit fabrication process, the composite tungsten film may be used as word and/or bit line metallization to read and write data to memory cell devices. For a word and/or bit line fabrication process, a preferred process sequence includes providing a substrate having a word and/or bit line pattern defined in a dielectric material layer. The word and/or bit line pattern defined in the dielectric material includes a barrier layer thereon. Thereafter, a composite tungsten film comprising sequentially deposited tungsten nucleation layers and tungsten bulk layers, each having a thickness less than about 300 Å, are formed one over the other on the barrier layer until a desired thickness for the composite tungsten film is achieved.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
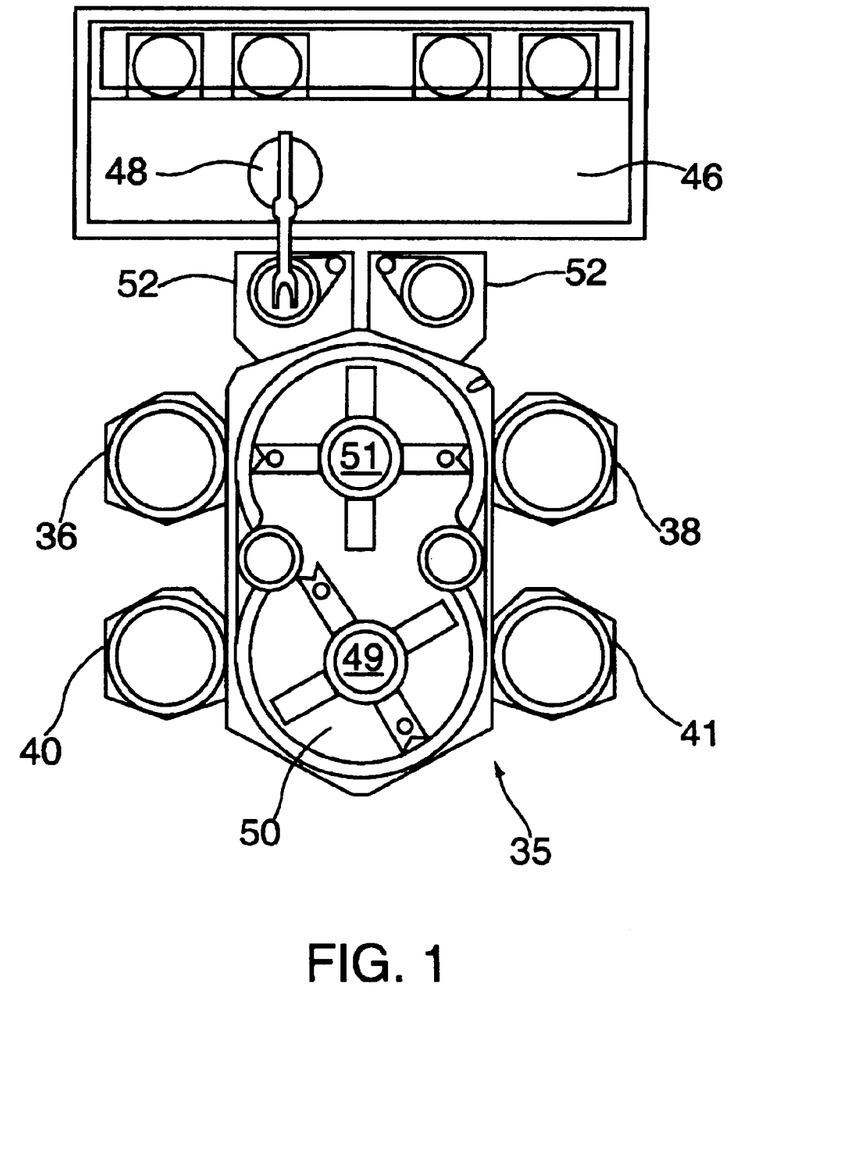
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. The wafer processing system 35 typically comprises process chambers 36, 38, 40, 41, transfer chamber 50, load-lock chambers 52, a factory interface 46, a microprocessor controller (not shown), along with other hardware components such as power supplies (not shown) and vacuum pumps (not shown). An example of such a wafer processing system 35 is an ENDURA SL system, available from Applied Materials, Inc., Santa Clara, Calif.

Details of the wafer processing system 35 are described in commonly assigned U.S. patent application Ser. No. 09/451, 628, entitled "Integrated Modular Processing Platform", filed on Nov. 30, 1999, which is hereby incorporated herein by reference. The salient features of the wafer processing system 35 are briefly described below.

The wafer processing system 35 includes a transfer chamber 50 containing two transfer robots 49, 51. The transfer chamber 50 is coupled to the factory interface 46 via load-lock chambers 52. Substrates (not shown) are loaded into the wafer processing system 35 through factory interface 46. A factory interface robot 48 moves the substrates from the factory interface 46 into the load-lock chambers 52.

Transfer chamber 50 is a coupled to a cluster of process chambers 36, 38, 40, 41. The transfer robots 49, 51 move the substrates between one or more of the process chambers 36, 38, 40, 41.

The process chambers 36, 38, 40, 41 are used to perform various integrated circuit fabrication sequences. For example, process chambers 36, 38, 40, 41 may include cyclical deposition chambers as well as chemical vapor deposition (CVD) chambers, among others.

Figure 2:
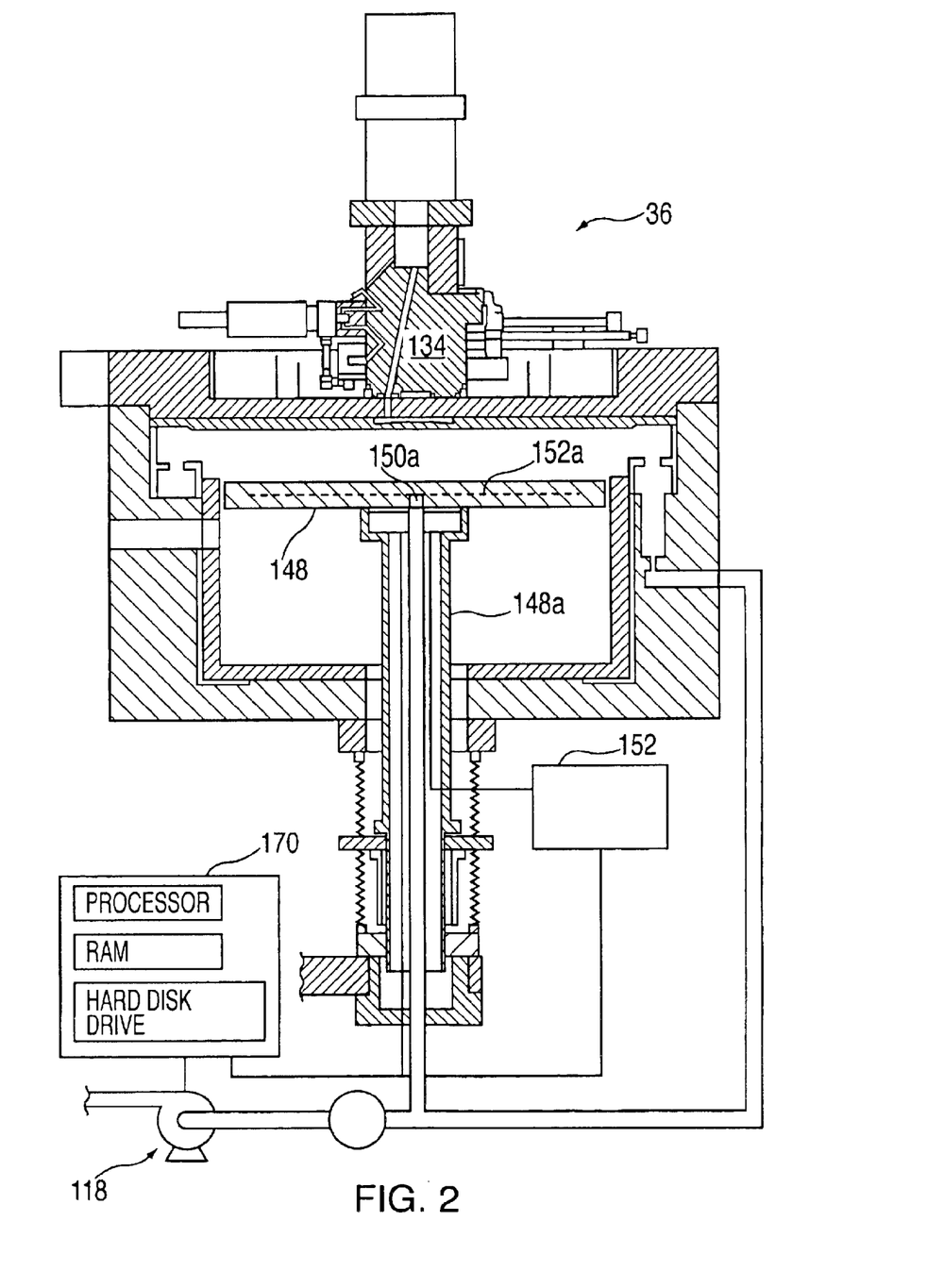
FIG. 2 depicts a schematic cross-sectional view of a process chamber that can be used to perform a cyclical deposition process described herein.

FIG. 2 depicts a schematic cross-sectional view of a process chamber 36 of wafer processing system 35 that can be used to perform a cyclical deposition process in accordance with embodiments described herein. The process chamber 36 generally houses a wafer support pedestal 148, which is used to support a substrate (not shown). The wafer support pedestal 148 is movable in a vertical direction inside the process chamber 36 using a displacement mechanism 148a.

Depending on the specific process, the substrate can be heated to some desired temperature prior to or during deposition. For example, the wafer support pedestal 148 may be heated using an embedded heater element 152a. The wafer support pedestal 148 may be resistively heated by applying an electric current from an AC power supply 152 to the heater element 152a. The substrate (not shown) is, in turn, heated by the pedestal 148. Alternatively, the wafer support pedestal 148 may be heated using radiant heaters, such as, for example, lamps.

A temperature sensor 150a, such as a thermocouple, is also embedded in the wafer support pedestal 148 to monitor the temperature of the pedestal 148 in a conventional manner. The measured temperature is used in a feedback loop to control the AC power supply 152 for the heating element 152a, such that the substrate temperature can be maintained or controlled at a desired temperature which is suitable for the particular process application.

A vacuum pump 118 is used to evacuate the process chamber 36 and to maintain the pressure inside the process chamber 36. A gas manifold 134, through which process gases are introduced into the process chamber 36, is located above the wafer support pedestal 148. The gas manifold 134 is connected to a gas panel (not shown), which controls and supplies various process gases to the process chamber 36.

Proper control and regulation of the gas flows to the gas manifold 134 are performed by mass flow controllers (not shown) and a microprocessor controller 170. The gas manifold 134 allows process gases to be introduced and uniformly distributed in the process chamber 36. Additionally, the gas manifold 134 may optionally be heated to prevent condensation of any reactive gases within the manifold.

The gas manifold 134 includes a plurality of electronic control valves (not shown). The electronic control valves as used herein refer to any control valve capable of providing rapid and precise gas flow to the process chamber 36 with valve open and close cycles of less than about 1–2 seconds, and more preferably less than about 0.1 second.

Figure 3:
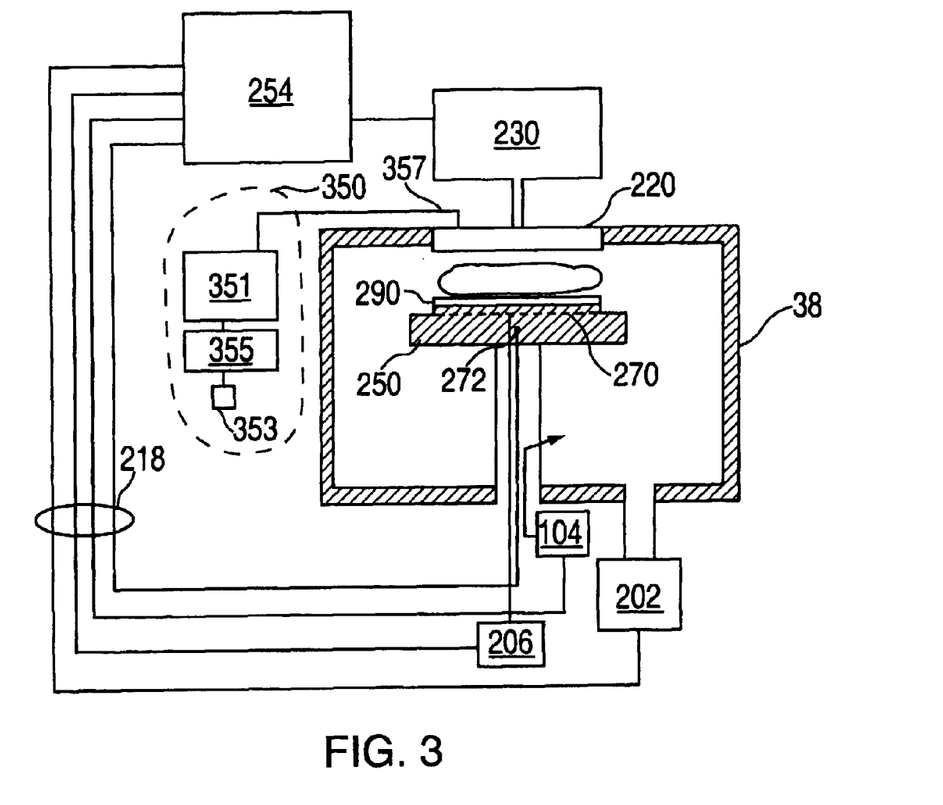
FIG. 3 depicts a schematic cross-sectional view of a process chamber that can be used to perform a chemical vapor deposition (CVD) process described herein.

FIG. 3 depicts a schematic cross-sectional view of a chemical vapor deposition (CVD) process chamber 38 of wafer processing system 35. An example of such a CVD chamber 38 is a WxZ™ chamber, commercially available from Applied Materials, Inc., Santa Clara, Calif.

The CVD chamber 38 generally houses a wafer support pedestal 250, which is used to support a substrate 290. The wafer support pedestal 250 is movable in a vertical direction inside the CVD chamber 38 using a displacement mechanism (not shown).

Depending on the specific CVD process, the substrate 290 can be heated to some desired temperature prior to or during deposition. For example, the wafer support pedestal 250 may be heated by an embedded heater element 270. The wafer support pedestal 250 may be resistively heated by applying an electric current from an AC power supply 206 to the heater element 270. The substrate 290 is, in turn, heated by the pedestal 250. The wafer support pedestal 250 is optionally heated using radiant heat (not shown).

A temperature sensor 272, such as a thermocouple, may also be embedded in the wafer support pedestal 250 to monitor the temperature of the pedestal 250 in a conventional manner. The measured temperature is used in a feedback loop to control the AC power supply 206 for the heating element 270, such that the substrate temperature can be maintained or controlled at a desired temperature which is suitable for the particular process application.

A vacuum pump 202 is used to evacuate the CVD chamber 38 and to maintain the proper gas flows and pressures inside the CVD chamber 38. A showerhead 220, through which process gases are introduced into the CVD chamber 38, is located above the wafer support pedestal 250. The showerhead 220 is connected to a gas panel 230, which controls and supplies various process gases provided to the CVD chamber 38.

Proper control and regulation of the gas flows through the gas panel 230 is performed by mass flow controllers (not shown) and a microprocessor controller 254. The showerhead 220 allows process gases from the gas panel 230 to be uniformly introduced and distributed in the CVD chamber 38.

The CVD chamber 38 may comprise additional components for enhancing layer deposition on the substrate 290. For example, the showerhead 220 and wafer support pedestal 250 may also form a pair of spaced apart electrodes. When an electric field is generated between these electrodes, the process gases introduced into the CVD chamber 38 may be ignited into a plasma.

Typically, the electric field is generated by coupling the wafer support pedestal 250 to a source of radio frequency (RF) power (not shown) through a matching network (not shown). Alternatively, the RF power source and matching network may be coupled to the showerhead 220, or coupled to both the showerhead 220 and the wafer support pedestal 250.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Optionally, a remote plasma source 350 may be coupled to the CVD process chamber 38 to provide a remote plasma thereto. The remote plasma source 350 includes a gas supply 353, a gas flow controller 355, a plasma chamber 351, and a chamber inlet 357. The gas flow controller 355 controls the flow of process gas from the gas supply 353 to the plasma chamber 351.

A remote plasma may be generated by applying an electric field to the process gas in the plasma chamber 351, creating a plasma of reactive species. Typically, the electric field is generated in the plasma chamber 351 using an RF power source (not shown). The reactive species generated in the remote plasma source 350 may be introduced into CVD process chamber 38 through inlet 357.

Process chamber 36 and the CVD process chamber 38 as described above are each controlled by a microprocessor controller 170 (FIG. 2), 254 (FIG. 3). The microprocessor controllers 170, 254 may be one of any form of general purpose computer processor (CPU) that can be used in an industrial setting for controlling various chambers and subprocessors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Composite Tungsten Film Formation

A method of forming a composite tungsten film on a substrate is described. The composite tungsten film comprises sequentially deposited tungsten nucleation layers and tungsten bulk layers. Each of the tungsten nucleation layers and the tungsten bulk layers have a thickness less than about 300 Å. The tungsten nucleation layers and the tungsten bulk layers are formed one over the other until a desired thickness for the composite tungsten layer is achieved. The resulting composite tungsten film exhibits good film morphology.

Figure 4:
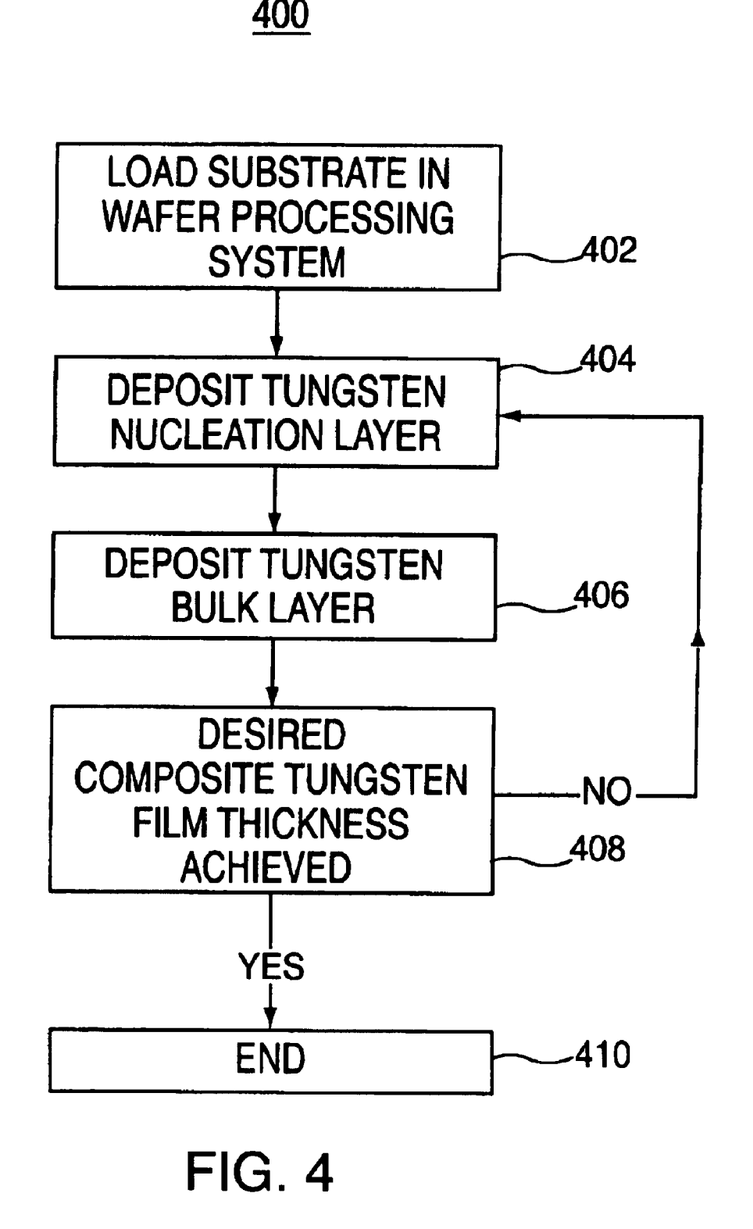
FIG. 4 illustrates a process sequence for tungsten composite film formation.

FIG. 4 illustrates a process sequence 400 detailing the various steps used for the deposition of the composite tungsten film. These steps may be performed in a wafer processing system similar to that described above with reference to FIGS. 1–3.

As indicated in step 402, a substrate is provided to a wafer processing system. The substrate may be for example, a silicon substrate having a word and/or bit line pattern defined in a dielectric material layer.

Referring to step 404 in FIG. 4, a tungsten nucleation layer is formed on the substrate. The tungsten nucleation layer may be formed in a deposition chamber similar to that described above with respect to FIG. 2. The thickness for the tungsten nucleation layer is variable depending on the device structure to be fabricated. Typically, the thickness for the tungsten nucleation layer is less than about 100 Å, preferably between about 15 Å to about 50 Å.

Figure 5:
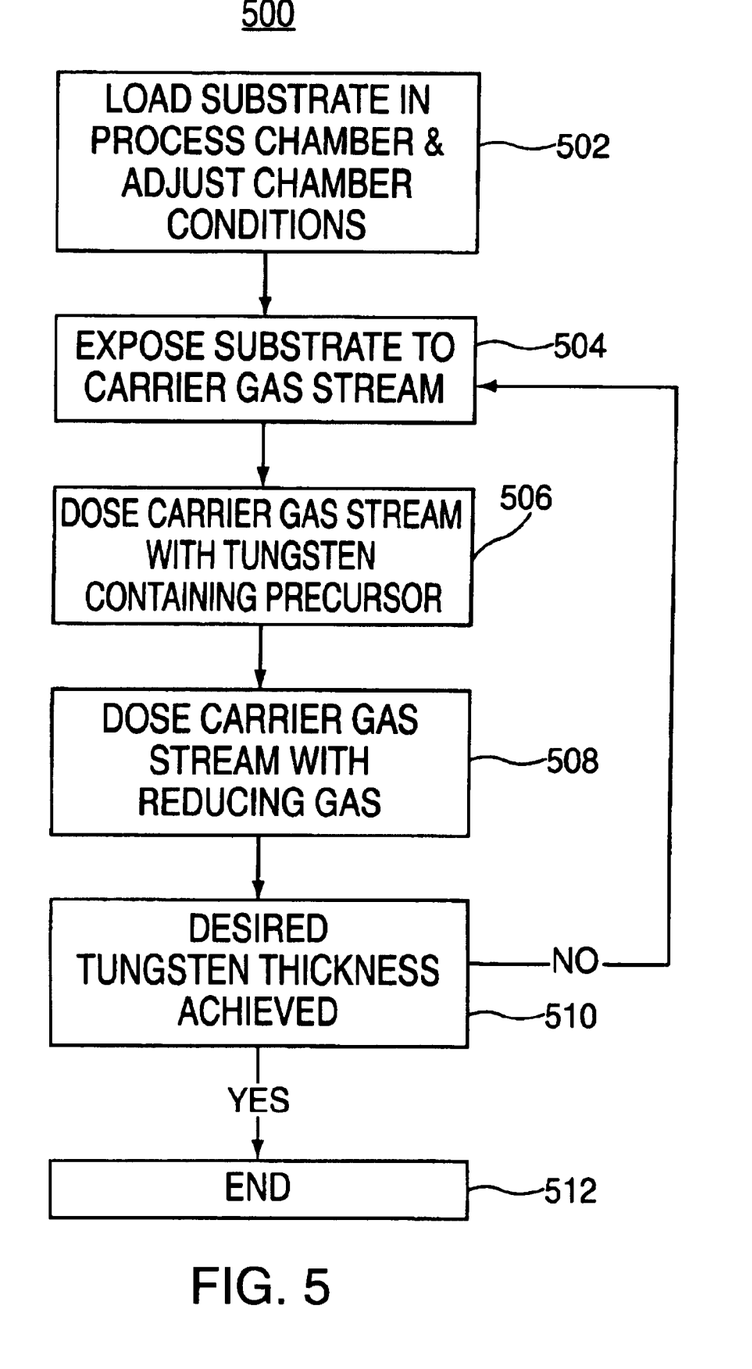
FIG. 5 illustrates a process sequence for tungsten nucleation layer formation using cyclical deposition techniques according to one embodiment described herein.

FIG. 5 illustrates an embodiment of a process sequence 500 according to the present invention detailing the various steps used for the deposition of the tungsten nucleation layer utilizing a constant carrier gas flow. As shown in step 502, a substrate is provided to a process chamber. The substrate may be for example, a silicon substrate ready for bit and/or word-line metallization during a dynamic random access memory (DRAM) fabrication process. The process chamber conditions such as, for example, the temperature and pressure are adjusted to enhance the adsorption of the process gases on the substrate. In general, for tungsten nucleation layer deposition, the substrate should be maintained at a temperature between about 200° C. and 400° C. at a process chamber pressure of between about 1 torr and about 10 torr.

In one embodiment where a constant carrier gas flow is desired, a carrier gas stream is established within the process chamber, as indicated in step 504. Carrier gases may be selected so as to also act as a purge gas for removal of volatile reactants and/or by-products from the process chamber. Carrier gases such as, for example, helium (He), argon (Ar), nitrogen ($N_2$) and hydrogen ($H_2$), and combinations thereof, among others may be used.

Referring to step 506, after the carrier gas stream is established within the process chamber, a pulse of a tungsten-containing precursor is added to the carrier gas stream. The term pulse as used herein refers to a dose of material injected into the process chamber or into the carrier gas stream. The pulse of the tungsten-containing precursor lasts for a predetermined time interval.

The time interval for the pulse of the tungsten-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the tungsten-containing precursor provides a sufficient amount of precursor so that at least a monolayer of the tungsten-containing precursor is adsorbed on the substrate. Thereafter, excess tungsten-containing precursor remaining in the chamber may be removed from the process chamber by the constant carrier gas stream in combination with the vacuum system.

In step 508, after the excess tungsten-containing precursor has been removed from the process chamber by the constant carrier gas stream, a pulse of a reducing gas is added to the carrier gas stream. The pulse of the reducing gas also lasts for a predetermined time interval that is variable as described above with reference to the tungsten-containing precursor. In general, the time interval for the pulse of the reducing gas should be long enough for adsorption of at least a monolayer of the reducing gas on the tungsten-containing precursor. Thereafter, excess reducing gas remaining in the chamber may be removed therefrom by the constant carrier gas stream in combination with the vacuum system.

Steps 504 through 508 comprise one embodiment of a deposition cycle for the tungsten nucleation layer. For such an embodiment, a constant flow of the carrier gas is provided to the process chamber modulated by alternating periods of pulsing and non-pulsing where the periods of pulsing alternate between the tungsten-containing precursor and the reducing gas along with the carrier gas stream, while the periods of non-pulsing include only the carrier gas stream.

The time interval for each of the pulses of the tungsten-containing precursor and the reducing gas may have the same duration. That is the duration of the pulse of the tungsten-containing precursor may be identical to the duration of the pulse of the reducing gas. For such an embodiment, a time interval ($T_1$) for the pulse of the tungsten-containing precursor is equal to a time interval ($T_2$) for the pulse of the reducing gas.

Alternatively, the time interval for each of the pulses of the tungsten-containing precursor and the reducing gas may have different durations. That is the duration of the pulse of the tungsten-containing precursor may be shorter or longer than the duration of the pulse of the reducing gas. For such an embodiment, the time interval ($T_1$) for the pulse of the tungsten-containing precursor is different than the time interval ($T_2$) for the pulse of the reducing gas.

In addition, the periods of non-pulsing between each of the pulses of the tungsten-containing precursor and the reducing gas may have the same duration. That is, the duration of the period of non-pulsing between each pulse of the tungsten-containing precursor and each pulse of the reducing gas may be identical. For such an embodiment, a time interval ($T_3$) of non-pulsing between the pulse of the tungsten-containing precursor and the pulse of the reducing gas is equal to a time interval ($T_4$) of non-pulsing between the pulse of the reducing gas and the pulse of the tungsten-containing precursor. During the time periods of non-pulsing only the constant carrier gas stream is provided to the process chamber.

Alternatively, the periods of non-pulsing between each of the pulses of the tungsten-containing precursor and the reducing gas may have different durations. That is, the duration of the period of non-pulsing between each pulse of the tungsten-containing precursor and each pulse of the reducing gas may be shorter or longer than the duration of the period of non-pulsing between each pulse of the reducing gas and the tungsten-containing precursor. For such an embodiment, a time interval ($T_3$) of non-pulsing between the pulse of the tungsten-containing precursor and the pulse of the reducing gas is different from a time interval ($T_4$) of non-pulsing between the pulse of the reducing gas and the pulse of the tungsten-containing precursor. During the time periods of non-pulsing only the constant carrier gas stream is provided to the process chamber.

Additionally, the time intervals for each pulse of the tungsten-containing precursor, the reducing gas and the periods of non-pulsing therebetween for each deposition cycle may have the same duration. For such an embodiment, a time interval ($T_1$) for the pulse of the tungsten-containing precursor, a time interval ($T_2$) for the pulse of the reducing gas, a time interval ($T_3$) of non-pulsing between the pulse of the tungsten-containing precursor and the pulse of the reducing gas and a time interval ($T_4$) of non-pulsing between the pulse of the reducing gas and the pulse of the tungsten-containing precursor, each have the same value for each deposition cycle. For example, in a first deposition cycle ($C_1$), a time interval ($T_1$) for the pulse of the tungsten-containing precursor has the same duration as the time interval ($T_1$) for the pulse of the tungsten-containing precursor in subsequent deposition cycles ($C_2 \ldots C_N$). Similarly, the duration of each pulse of the reducing gas as well as the periods of non-pulsing between the pulse of the tungsten-containing precursor and the reducing gas in the first deposition cycle ($C_1$) is the same as the duration of each pulse of the reducing gas and the periods of non-pulsing between the pulse of the tungsten-containing precursor and the reducing gas in subsequent deposition cycles ($C_2 \ldots C_N$), respectively.

Alternatively, the time intervals for at least one pulse of the tungsten-containing precursor, the reducing gas and the periods of non-pulsing therebetween for one or more of the deposition cycles of the tungsten deposition process may have different durations. For such an embodiment, one or more of the time intervals ($T_1$) for the pulses of the tungsten-containing precursor, the time intervals ($T_2$) for the reducing gas, the time intervals ($T_3$) of non-pulsing between the pulse of the tungsten-containing precursor and the pulse of the reducing gas and the time intervals ($T_4$) of non-pulsing between the pulse of the reducing gas and the pulse of the tungsten-containing precursor may have different values for one or more deposition cycles of the tungsten deposition process. For example, in a first deposition cycle ($C_1$), the time interval ($T_1$) for the pulse of the tungsten-containing precursor may be longer or shorter than the time interval ($T_1$) for the pulse of the tungsten-containing precursor in subsequent deposition cycles ($C_2 \ldots C_N$). Similarly, the duration of each pulse of the reducing gas and the periods of non-pulsing between the pulse of the tungsten-containing precursor and the reducing gas in deposition cycle ($C_1$) may be the same or different then the duration of corresponding pulses of the reducing gas and the periods of non-pulsing between the pulse of the tungsten-containing precursor and the reducing gas in subsequent deposition cycles ($C_2 \ldots C_N$), respectively.

Referring to step 510, after each deposition cycle (steps 504 through 508) a thickness of tungsten will be formed on the substrate. Depending on specific device requirements, subsequent deposition cycles may be needed to achieve a desired thickness. As such, steps 504 through 508 are repeated until the desired thickness for the tungsten nucleation layer is achieved. Thereafter, when the desired thickness for the tungsten nucleation layer is achieved the process is stopped as indicated by step 512.

Figure 6:
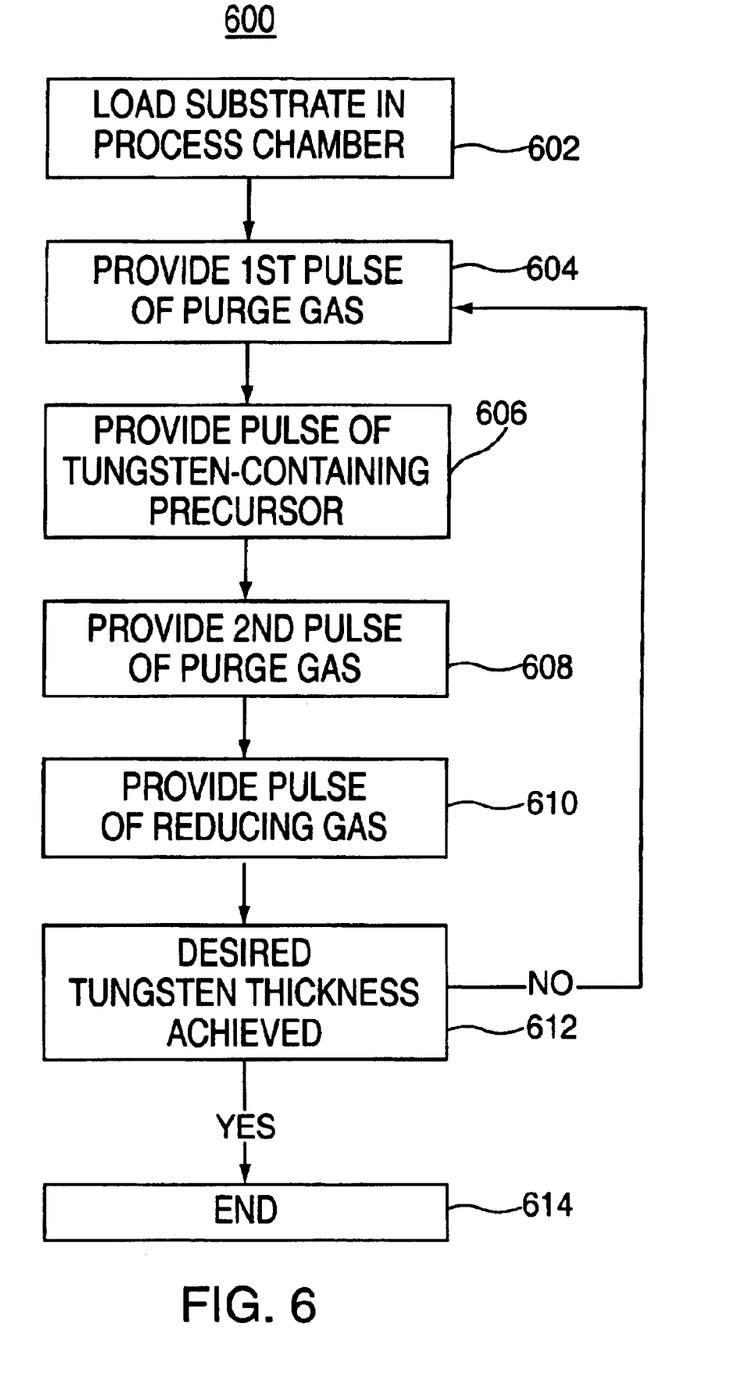
FIG. 6 illustrates a process sequence for tungsten nucleation layer formation using cyclical deposition techniques according to an alternate embodiment described herein.

In an alternate process sequence described with respect to FIG. 6, the tungsten nucleation layer deposition cycle comprises separate pulses for each of the tungsten-containing precursor, the reducing gas and a purge gas. For such an embodiment, a tungsten nucleation layer deposition sequence 600 includes providing a substrate to the process chamber (step 602), providing a first pulse of a purge gas to the process chamber (step 604), providing a pulse of a tungsten-containing precursor to the process chamber (step 606), providing a second pulse of the purge gas to the process chamber (step 608), providing a pulse of the reducing gas to the process chamber (step 610), and then repeating steps 604 through 608, or stopping the deposition process (step 614) depending on whether a desired thickness for the tungsten nucleation layer has been achieved (step 612).

The time intervals for each of the pulses of the tungsten-containing precursor, the reducing gas and the purge gas may have the same or different durations as discussed above with respect to FIG. 5. Alternatively, corresponding time intervals one or more pulses of the tungsten-containing precursor, the reducing gas and the purge gas in one or more of the deposition cycles of the tungsten nucleation deposition process may have different durations.

In FIGS. 5–6, the tungsten nucleation layer deposition cycle is depicted as beginning with a pulse of the tungsten-containing precursor followed by a pulse of the reducing gas. Alternatively, the tungsten nucleation layer deposition cycle may start with a pulse of the reducing gas followed by a pulse of the tungsten-containing precursor.

Suitable tungsten-containing precursors for forming the tungsten nucleation layer may include for example, tungsten hexafluoride ($WF_6$) and tungsten carbonyl, among others. Suitable reducing gases may include for example, silane ($SiH_4$), disilane ($Si_2H_6$), dichlorosilane ($SiCl_2H_2$), borane ($BH_3$), diborane ($B_2H_6$), triborane, tetraborane, pentaborane, hexaborane, heptaborane, octaborane, nonaborane, and decaborane, among others.

One exemplary process of depositing a tungsten nucleation layer comprises sequentially providing pulses of tungsten hexafluoride ($WF_6$) and pulses of diborane ($B_2H_6$). The tungsten hexafluoride ($WF_6$) may be provided to an appropriate flow control valve, for example, an electronic control valve, at a flow rate of between about 10 sccm (standard cubic centimeters per minute) and about 400 sccm, preferably between about 20 sccm and about 100 sccm, and thereafter pulsed for about 1 second or less, preferably about 0.2 seconds or less. A carrier gas comprising argon is provided along with the tungsten hexafluoride (WF$_6$) at a flow rate between about 250 sccm to about 1000 sccm, preferably between about 500 sccm to about 750 sccm. The diborane (B$_2$H$_6$) may be provided to an appropriate flow control valve, for example, an electronic control valve, at a flow rate of between about 5 sccm and about 150 sccm, preferably between about 5 sccm and about 25 sccm, and thereafter pulsed for about 1 second or less, preferably about 0.2 seconds or less. A carrier gas comprising argon is provided along with the diborane at a flow rate between about 250 sccm to about 1000 sccm, preferably between about 500 sccm to about 750 sccm. The substrate may be maintained at a temperature between about 250° C. to about 350° C. at a chamber pressure between about 1 torr to about 10 torr.

Another exemplary process of depositing a tungsten nucleation layer comprises sequentially providing pulses of tungsten hexafluoride (WF$_6$) and pulses of silane (SiH$_4$). The tungsten hexafluoride (WF$_6$) may be provided to an appropriate flow control valve, for example, an electronic control valve at a flow rate of between about 10 sccm and about 400 sccm, preferably between about 20 sccm and about 100 sccm, and thereafter pulsed for about 1 second or less, preferably about 0.2 seconds or less. A carrier gas comprising argon is provided along with the tungsten hexafluoride at a flow rate between about 250 sccm to about 1000 sccm, preferably between 300 sccm to about 500 sccm. The silane (SiH$_4$) may be provided to an appropriate flow control valve, for example, an electronic control valve, at a flow rate between about 10 sccm to about 500 sccm, preferably between about 50 sccm to about 200 sccm, and thereafter pulsed for about 1 second or less, preferably about 0.2 seconds or less. A carrier gas comprising argon is provided along with the silane at a flow rate between about 250 sccm to about 1000 sccm, preferably between about 300 sccm to about 500 sccm. A pulse of a purge gas comprising argon at a flow rate between about 300 sccm to about 1000 sccm, preferably between about 500 sccm to about 750 sccm, in pulses of about 1 second or less, preferably about 0.3 seconds or less is provided between the pulses of the tungsten hexafluoride (WF$_6$) and the pulses of the silane (SiH$_4$). The substrate may be maintained at a temperature between about 300° C. to about 400° C. at a chamber pressure between about 1 torr to about 10 torr.

Referring to step 406 in FIG. 4, after the tungsten nucleation layer is formed on the substrate, a tungsten bulk layer is formed thereover. The tungsten bulk layer may be formed in a CVD process chamber similar to that described above with respect to FIG. 3. The thickness for the tungsten bulk layer is variable depending on the device structure to be fabricated. Typically, the thickness for the tungsten bulk layer is less than about 300 Å, preferably between about 150 Å to about 250 Å.

One exemplary process of depositing a tungsten bulk layer comprises thermally decomposing a tungsten-containing precursor, such as for example, tungsten hexafluoride (WF$_6$). The tungsten hexafluoride (WF$_6$) may be provided at an undiluted flow rate of between about 10 sccm and about 400 sccm, preferably between about 200 sccm and about 250 sccm. A carrier gas comprising argon is provided along with the tungsten hexafluoride (WF$_6$) at a flow rate between about 250 sccm to about 1000 sccm, preferably between about 300 sccm to about 650 sccm. The substrate may be maintained at a temperature between about 450° C. to about 600° C. at a chamber pressure between about 10 torr to about 30 torr. The above process parameters provide a deposition rate for the tungsten bulk layer in a range of about 10 Å/min to about 100 Å/min when implemented on a 200 mm (millimeter) substrate in a deposition chamber available from Applied Materials, Inc., located in Santa Clara, Calif.

Other CVD deposition chambers are within the scope of the invention, and the parameters listed above may vary according to the particular deposition chamber used to form the tungsten bulk layer. For example, other deposition chambers may have a larger (e.g., configured to accommodate 300 mm substrates) or smaller volume, requiring gas flow rates that are larger or smaller than those recited for deposition chambers available from Applied Materials, Inc. Other methods for heating substrates such as, for example, heater lamps may also be used.

Referring to step 408 in FIG. 4, after the tungsten bulk layer (step 406) is formed on the tungsten nucleation layer (step 404) the total thickness of the composite tungsten film is determined. As such, when a desired thickness for the composite tungsten film has not been achieved, steps 404 through 406 are repeated. However, when the desired thickness for the composite tungsten film is achieved, the process is stopped as indicated by step 410.

The thickness for the composite tungsten film is variable depending on the device structure to be fabricated. Typically, the composite tungsten film may have a thickness between about 500 Å to about 3000 Å.

Alternately depositing thin tungsten bulk layers over tungsten nucleation layers advantageously forms composite tungsten (W) layers having a smooth film morphology. Not wishing to be bound by theory, it is believed that the formation of the thin CVD deposited tungsten bulk layers prevents the tungsten grain sizes from growing too large. Additionally, the tungsten nucleation layers formed by alternately adsorbing monolayers of a tungsten-containing precursor and a reducing gas are believed to stuff grain boundaries on the CVD deposited tungsten bulk layers thereby providing a composite film having a smooth surface morphology.

Figure 7:
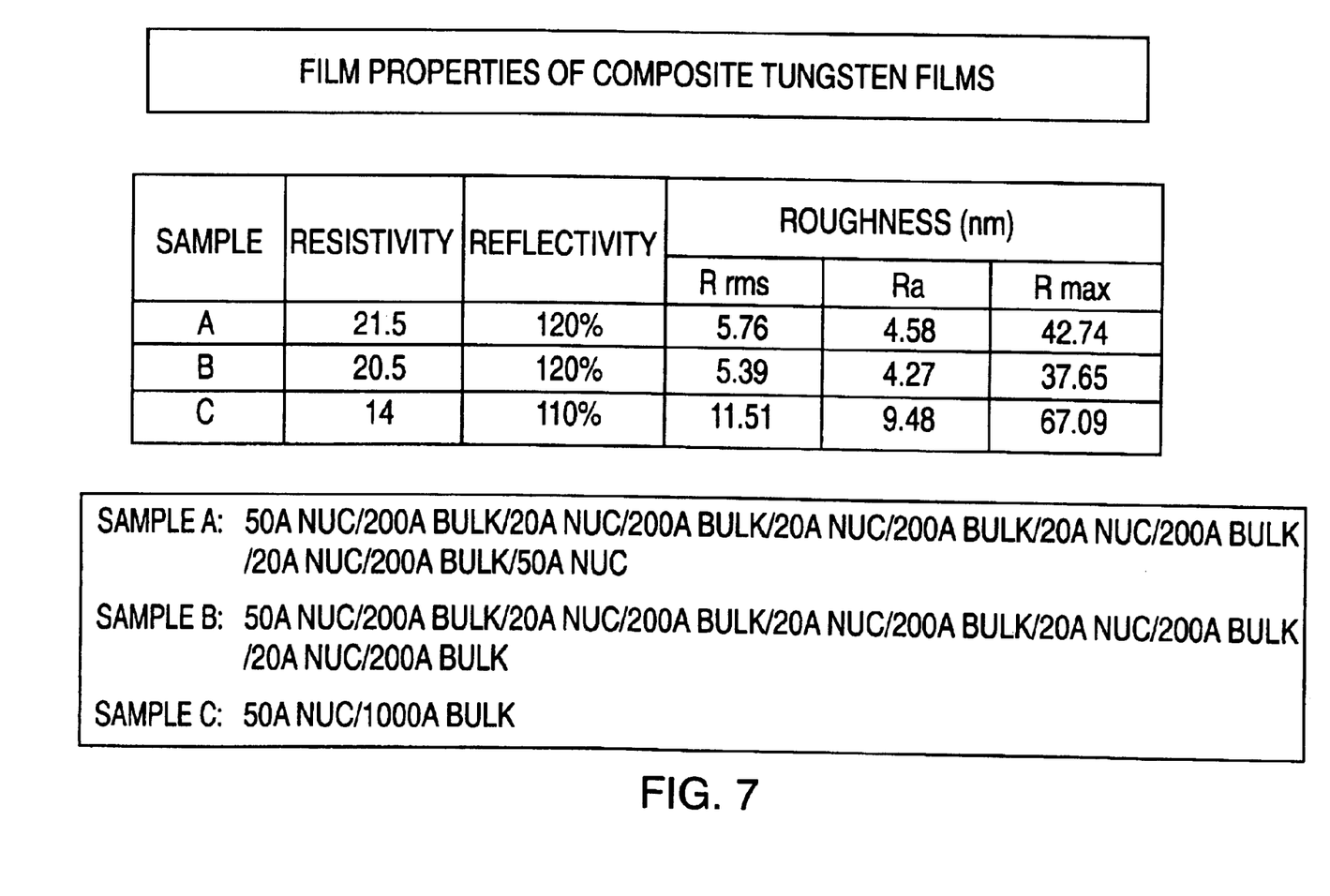
FIG. 7 depicts surface roughness data for composite tungsten films of the present invention and thick chemical vapor deposition (CVD) tungsten films.

Referring to FIG. 7, SAMPLE B illustrates one embodiment of a composite tungsten film comprising sequentially deposited tungsten nucleation layers and tungsten bulk layers. The deposition sequence includes a thicker first nucleation layer with thinner inter-stage tungsten nucleation layers. For example, the deposition sequence for SAMPLE B includes a 50 Å tungsten nucleation layer/200 Å tungsten bulk layer/20 Å tungsten nucleation layer/200 Å tungsten bulk layer/20 Å tungsten nucleation layer/200 Å tungsten bulk layer/20 Å tungsten nucleation layer/200 Å tungsten bulk layer/20 Å tungsten nucleation layer/200 Å tungsten bulk layer formed one over the other.

For SAMPLE B, each of the tungsten nucleation layers was formed by sequentially adsorbing monolayers of tungsten hexafluoride (WF$_6$) and monolayers of diborane (B$_2$H$_6$). The tungsten hexafluoride (WF$_6$) was provided to an electronic control valve at a flow rate of about 50 sccm, and thereafter pulsed for about 0.2 seconds. A carrier gas comprising argon was provided along with the tungsten hexafluoride (WF$_6$) at a flow rate of about 550 sccm. The diborane (B$_2$H$_6$) was provided to an electronic control valve at a flow rate of about 25 sccm, and thereafter pulsed for about 0.2 seconds. A carrier gas comprising argon was provided along with the diborane at a flow rate of 500 sccm. The substrate was maintained at a temperature of about 300° C., at a chamber pressure of about 5 torr.

For SAMPLE B, each of the tungsten bulk layers was formed by thermally decomposing tungsten hexafluoride (WF$_6$). The tungsten hexafluoride (WF$_6$) was provided at a flow rate of about 200 sccm. A carrier gas comprising argon was provided along with the tungsten hexafluoride (WF$_6$) at a flow rate of about 500 sccm. The substrate was maintained at a temperature of about 550° C., at a chamber pressure of about 10 torr.

Each of the tungsten nucleation layers and the tungsten bulk layers were formed by sequentially transferring the substrate between a tungsten nucleation process chamber similar to that described above with respect to FIG. 2 and a CVD process chamber described above with respect to FIG. 3. Alternatively, both the tungsten nucleation layers and the tungsten bulk layers may be formed in a single process chamber for improved throughput.

SAMPLE B had a surface roughness Ra of about 4.27 nm (nanometers), a root mean square roughness R rms of about 5.39 nm and a maximum roughness R max of about 37.65 nm. Such values for the surface roughness provide a smooth surface morphology for the composite tungsten film that is sufficient for subsequent lithography steps performed thereover.

SAMPLE A illustrates another embodiment of a composite tungsten film comprising sequentially deposited tungsten nucleation layers and tungsten bulk layers. The deposition sequence includes a thicker first and last tungsten nucleation layers with thinner inter-stage tungsten nucleation layers. For example, the deposition sequence for SAMPLE A includes a 50 Å tungsten nucleation layer/200 Å tungsten bulk layer/20 Å tungsten nucleation layer/200 Å tungsten bulk layer/20 Å tungsten nucleation layer/200 Å tungsten bulk layer/20 Å tungsten nucleation layer/200 Å tungsten bulk layer/20 Å tungsten nucleation layer/200 Å tungsten bulk layer/50 Å tungsten nucleation layer formed one over the other.

For SAMPLE A, each of the tungsten nucleation layers and the tungsten bulk layers were formed in separate process chambers according to the process parameters described above with respect to SAMPLE B. SAMPLE A had a surface roughness Ra of about 4.58 nm, a root mean square roughness R rms of about 5.76 nm and a maximum roughness R max of about 42.74 nm. Such values for the surface roughness provide a smooth surface morphology for the composite tungsten film that is sufficient for subsequent lithography steps performed thereover.

In contrast, SAMPLE C illustrates a composite tungsten film comprising a single tungsten nucleation layer with a single thick tungsten bulk layer thereon. For example, the deposition sequence for SAMPLE C includes a 50 Å tungsten nucleation layer/1000 Å tungsten bulk layer. The tungsten nucleation layer and the tungsten bulk layer were each formed in separate process chambers according to the process parameters described above with respect to SAMPLE B. SAMPLE C had a surface roughness Ra of about 9.48 nm and a maximum roughness R max of about 67.09 nm, more than two times rougher than for SAMPLE A and SAMPLE B. The surface roughness values for SAMPLE C provide a much rougher surface morphology for the composite tungsten film that is insufficient for subsequent lithography steps performed thereover.

Integrated Circuit Fabrication Process

Figure 8A:
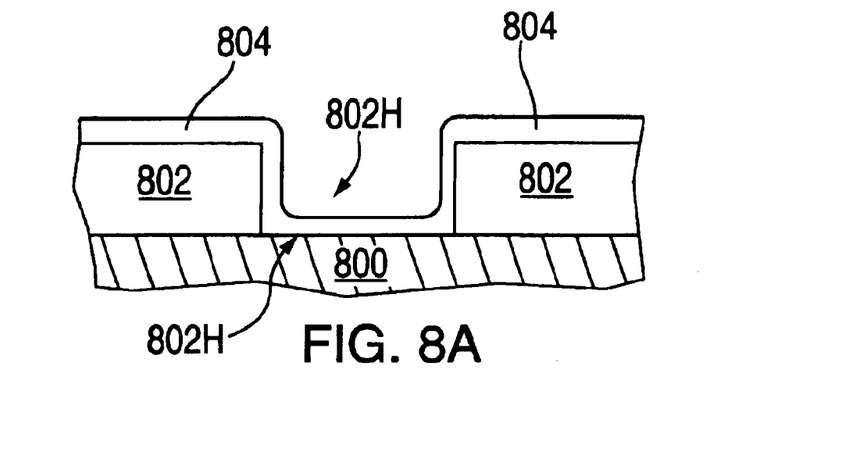
FIGS. 8A–8B illustrate schematic cross-sectional views of an integrated circuit at different stages of fabrication incorporating word and/or bit-line structures.
Figure 8B:
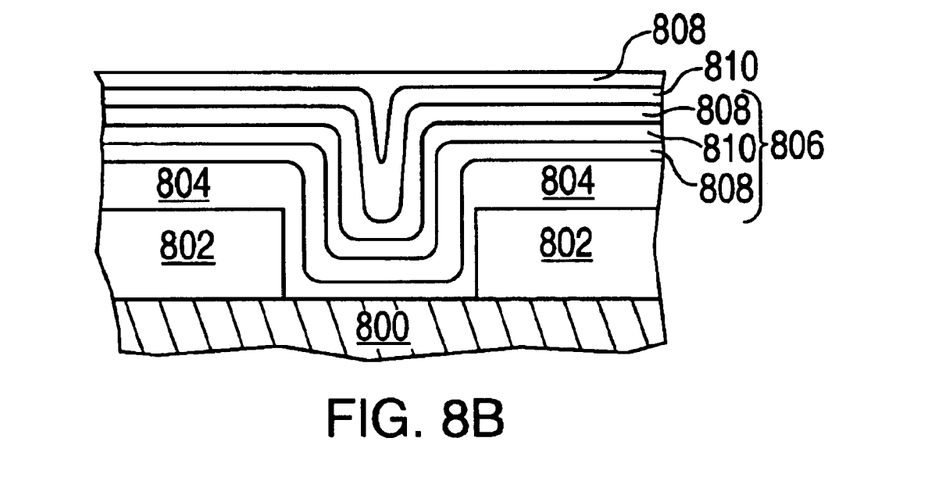

FIGS. 8A–8B illustrate cross-sectional views of a substrate at different stages of a fabrication process incorporating the composite tungsten film of the present invention as word and/or bit line metallization to read and write date to memory cell devices. FIG. 8A, for example, illustrates a cross-sectional view of a substrate 800 having a dielectric layer 802 thereon. The substrate 800 may comprise a semiconductor material such as, for example, silicon (Si), germanium (Ge), or gallium arsenide (GaAs). The dielectric material may comprise an insulating material such as, for example, silicon oxide or silicon nitride. The dielectric layer 802 has at least one aperture 802H formed therein. The at least one aperture 802H may be formed using conventional lithography and etching techniques.

The at least one aperture 802H may have a barrier layer 804 thereon. The barrier layer 804 may comprise for example, titanium nitride (TiN) or tantalum nitride (TaN), among others. The barrier layer 804 may be formed using conventional deposition techniques.

Referring to FIG. 8B, a composite tungsten film 806 comprising sequentially deposited tungsten nucleation layers 808 and tungsten bulk layers 810 are used to fill the at least one aperture 802H. The composite tungsten film 806 is formed using the deposition techniques described above with respect to FIGS. 4–6. The resulting composite tungsten film exhibits good film morphology.

While the foregoing is directed to the preferred embodiments of the present invention, other and further embodiments of the invention may be devised without departing from the basic scope thereof, and the scope thereof is determined by the claims that follow.

What is claimed is:

1. A method of forming a composite tungsten film, comprising:
    sequentially depositing tungsten nucleation layers and tungsten bulk layers on a substrate to form a composite tungsten layer, wherein each of the tungsten nucleation layers and the tungsten bulk layers have a thickness less than about 300 Å.

2. The method of claim 1 wherein each of the tungsten bulk layers has a thickness within a range of about 150 Å to about 250 Å.

3. The method of claim 1 wherein each of the tungsten nucleation layers has a thickness within a range of about 15 Å to about 50 Å.

4. The method of claim 1 wherein the composite tungsten film has a thickness within a range of about 500 Å to about 3000 Å.

5. The method of claim 1 wherein each of the tungsten nucleation layers is deposited by alternately adsorbing a tungsten-containing precursor and a reducing gas on the substrate.

6. The method of claim 5 wherein the tungsten-containing precursor is selected from the group consisting of tungsten hexafluoride and tungsten carbonyl.

7. The method of claim 5 wherein the reducing gas is selected from the group consisting of silane, disilane, dichlorosilane, borane, diborane, triborane, tetraborane, pentaborane, hexaborane, heptaborane, octaborane, nonaborane, and decaborane.

8. The method of claim 5 wherein the tungsten nucleation layer is deposited at a temperature within a range of about 200° C. to about 400° C.

9. The method of claim 5 wherein the tungsten nucleation layer is deposited at a pressure within a range of about 1 torr to about 10 torr.

10. The method of claim 1 wherein each of the tungsten bulk layers is deposited by thermally decomposing a gas mixture comprising a tungsten-containing precursor.

11. The method of claim 10 wherein the tungsten-containing precursor is selected from the group consisting of tungsten hexafluoride and tungsten carbonyl.

12. The method of claim 10 wherein the tungsten bulk layer is deposited at a temperature within a range of about 450° C. to about 650° C.

13. The method of claim 10 wherein the tungsten bulk layer is deposited at a pressure within a range of about 10 torr to about 30 torr.

14. The method of claim 1 wherein the tungsten nucleation layers are deposited in a different process chamber than that used to deposit the tungsten bulk layers.

15. The method of claim 1 wherein the tungsten nucleation layers are deposited in the same process chamber used to deposit the tungsten bulk layers.

16. A method of forming a composite tungsten film, comprising:

sequentially depositing tungsten nucleation layers and tungsten bulk layers on a substrate to form a composite tungsten layer, wherein each of the tungsten nucleation layers is deposited by alternately adsorbing a tungsten-containing precursor and a reducing gas on the substrate and wherein each of the tungsten bulk layers is deposited by thermally decomposing a gas mixture comprising a tungsten-containing precursor.

17. The method of claim 16 wherein each of the tungsten bulk layers has a thickness within a range of about 150 Å to about 250 Å.

18. The method of claim 16 wherein each of the tungsten nucleation layers has a thickness within a range of about 15 Å to about 50 Å.

19. The method of claim 16 wherein the composite tungsten film has a thickness within a range of about 500 Å to about 3000 Å.

20. The method of claim 16 wherein the tungsten-containing precursor is selected from the group consisting of tungsten hexafluoride and tungsten carbonyl.

21. The method of claim 16 wherein the reducing gas is selected from the group consisting of silane, disilane, dichlorosilane, borane, diborane, triborane, tetraborane, pentaborane, hexaborane, heptaborane, octaborane, nonaborane and decaborane.

22. The method of claim 16 wherein the tungsten nucleation layer is deposited at a temperature within a range of about 200° C. to about 400° C.

23. The method of claim 16 wherein the tungsten nucleation layer is deposited at a pressure within a range of about 1 torr to about 10 torr.

24. The method of claim 16 wherein the tungsten bulk layer is deposited at a temperature within a range of about 450° C. to about 650° C.

25. The method of claim 18 wherein the tungsten bulk layer is deposited at a pressure within a range of about 10 torr to about 30 torr.

26. The method of claim 18 wherein the tungsten nucleation layers are deposited in a different process chamber than that used to deposit the tungsten bulk layers.

27. The method of claim 16 wherein the tungsten nucleation layers are deposited in the same process chamber used to deposit the tungsten bulk layers.

28. The method of claim 16 further comprising:

depositing a dielectric layer on the substrate surface;

forming at least one aperture within the dielectric layer; and depositing a barrier layer comprising titanium nitride or tantalum nitride on the dielectric layer prior to the sequentially depositing tungsten.

29. The method of claim 28 wherein the composite tungsten film has a thickness within a range of about 500 Å to about 3000 Å.

30. A method for forming a composite tungsten film for use in a memory cell, comprising:

providing a substrate structure, wherein the substrate structure comprises an insulating material comprising, silicon oxide or silicon nitride, having at least one aperture formed therein; and sequentially depositing tungsten nucleation layers and tungsten bulk layers, at least partially within the at least one aperture to form a composite tungsten layer, wherein the tungsten nucleation layers are deposited by alternately adsorbing a tungsten-containing precursor and a reducing gas on the substrate structure and wherein the tungsten bulk layers are deposited by thermally decomposing the tungsten-containing precursor.

31. The method of claim 30 wherein each of the tungsten bulk layers has a thickness within a range of about 150 Å to about 250 Å.

32. The method of claim 30 wherein each of the tungsten nucleation layers has a thickness within a range of about 15 Å to about 50 Å.

33. The method of claim 30 wherein the composite tungsten film has a thickness within a range of about 500 Å to about 3000 Å.

34. The method of claim 30 wherein the tungsten-containing precursor is selected from the group consisting of tungsten hexafluoride and tungsten carbonyl.

35. The method of claim 30 wherein the reducing gas is selected from the group consisting of silane, disilane, dichlorosilane, borane, diborane, triborane, tetraborane, pentaborane, hexaborane, heptaborane, octaborane, nonaborane, and decaborane.

36. The method of claim 30 wherein the tungsten nucleation layer is deposited at a temperature within a range of about 200° C. to about 400° C.

37. The method of claim 30 wherein the tungsten nucleation layer is deposited at a pressure within a range of about 1 torr to about 10 torr.

38. The method of claim 30 wherein the tungsten bulk layer is deposited at a temperature within a range of about 450° C. to about 650° C.

39. The method of claim 30 wherein the tungsten bulk layer is deposited at a pressure within a range of about 10 torr to about 30 torr.

40. The method of claim 30 wherein the tungsten nucleation layers are deposited in a different process chamber than that used to deposit the tungsten bulk layers.

41. The method of claim 30 wherein the tungsten nucleation layers are deposited in the sane process chamber used to deposit the tungsten bulk layers.

42. The method of claim 30 wherein the composite tungsten film is used for word or bit metallization, or both.

43. The method of claim 30 wherein each of the tungsten bulk layers has a thickness of less than about 300 Å.

* * * * *